United States Patent [19]

Kitagawa

[11] 4,170,768

[45] Oct. 9, 1979

[54] KEY CODE GENERATOR

[75] Inventor: Hiroshi Kitagawa, Hamamatsu, Japan

[73] Assignee: Kabushiki Kaisha Kawai Gakki Seisakusho, Hamamatsu, Japan

[21] Appl. No.: 811,637

[22] Filed: Jun. 30, 1977

[30] Foreign Application Priority Data

Jul. 2, 1976 [JP] Japan ............ 51-78644

[51] Int. Cl.[2] ............ H03K 1/00

[52] U.S. Cl. ............ 340/365 S; 84/1.03; 84/1.01; 340/365 R

[58] Field of Search ............ 84/1.01, 1.03, 1.24, 84/DIG. 2, DIG. 7, DIG. 23; 340/365 R, 365 S

[56] References Cited

U.S. PATENT DOCUMENTS

| | | | |
|---|---|---|---|
| 3,902,397 | 9/1975 | Morez | 84/1.01 |
| 4,022,098 | 5/1977 | Deutsch | 84/1.01 |

*Primary Examiner*—Gene Z. Rubinson
*Assistant Examiner*—Leonard W. Pojunas, Jr.

[57] ABSTRACT

A key code generator for electronic musical instruments which has a group of memories respectively corresponding to blocks of key switches and temporarily storing their closed state, a block detector for detecting the memories corresponding to the blocks that even one key switch is in its closed state, a priority selector for sequentially designating the detected blocks in the order of priority, a block designating gate means for supplying clock pulses to the memories corresponding to the designated blocks to serially derive therefrom their information in accordance with the output from the priority selector, an encoder for encoding the output from the priority selector into a binary code, a counter for counting the clock pulses outputted from the block designating gate means, means for gating the count value of the counter and the binary code designating each block with the serial output read out of each memory, means for detecting a change in the binary code, and means for resetting the counter with the output from the detecting means, and in which the binary code gated with the serial output from the memory and outputted is used as key code information.

3 Claims, 15 Drawing Figures

KEY CODE GENERATOR

BACKGROUND OF THE INVENTION

1. Field of the Invention

This invention relates to a key code generator for electronic musical instruments.

2. Description of the Prior Art

Conventional key code generators have usually employed, as a method for detecting closed key switches, the key code multiplex method that information of the closed state of the key switches is rendered by time-division scanning of the respective key switches into a TDM (Time-Division Modulation) signal or a PCM (Pulse Code Modulation) signal synchronized therewith. With the key code multiplex method, however, one scanning period is needed for obtaining information necessary for time-division scanning of the respective key switches for detecting the open and closed states of the key switches. In the case of an ordinary electronic organ, if the key switches are divided into blocks and if the player uses each of his arms for two blocks and his feet for one block, five blocks are needed at most. For example, if the key switches are divided into groups every octave, they are divided into seventeen blocks including 61 upper keys, 61 lower keys and 25 foot keys. It is apparent that at least twelve blocks do not take part in playing. Therefore, it is sufficient to scan only five blocks. Further, sending of time-division clock pulses to the key switches is subject to a restriction by the characteristics of the switches, that is, their chattering and time constants, with the result that an erroneous operation is liable to occur due to a waveform distortion and that the limit of high-speed operation by the circuit integration is suppressed low. Moreover, in the case of flowing a high-frequency clock pulse between the switch and the circuit, it may become a noise source with respect to other circuits.

SUMMARY OF THE INVENTION

This invention has for its object to provide a key code generator for electronic musical instruments which overcomes the abovesaid defects of the prior art and which is designed to apply time-division clock pulses to key switches to provide a time slot only for a changed one of the key switches without scanning, and which is adapted for a high-speed operation resulting from integration by speeding up a response to closing of the changed key switch.

According to this invention, there is provided a key code generator which comprises a group of memories respectively corresponding to blocks of key switches and temporarily storing their closed state, a block detector for detecting the memories corresponding to the blocks that even one key switch is in its closed state, a priority selector for sequentially designating the detected blocks in the order of priority, a block designating gate means for supplying clock pulses to the memories corresponding to the designated blocks to serially derive therefrom their information in accordance with the output from the priority selector, an encoder for encoding the output from the priority selector into a binary code, a counter for counting the clock pulses outputted from the block designating gate means, means for gating the count value of the counter and the binary code designating each block with the serial output read out of each memory, and means for resetting the counter with the output from the detecting means, and in which the binary code gated with the serial output from the memory and outputted is used as key code information.

Other objects, features and advantages of this invention will become more fully apparent from the following description taken in conjunction with the accompanying drawings.

DESCRIPTION OF THE PREFERRED EMBODIMENTS

With reference to the drawings, the present invention will hereinafter be described with regard to its embodiments.

Figure 1:
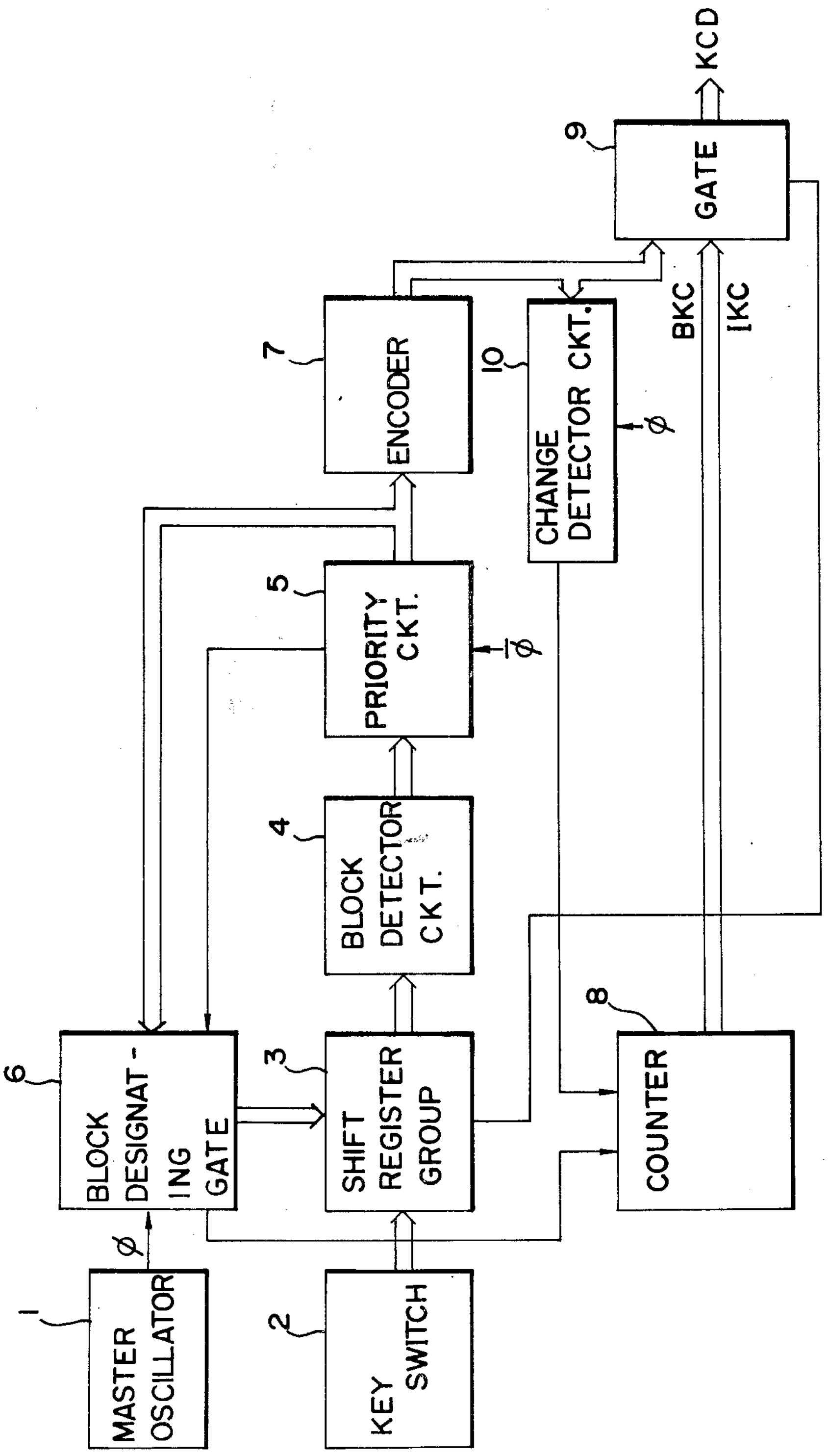
FIG. 1 is a block diagram illustrating an embodiment of this invention.

FIG. 1 illustrates in block form an embodiment of this invention. In FIG. 1, a key switch 2 is divided into blocks, which are respectively connected to parallel input terminals of a group of shift registers provided corresponding to the blocks. These shift registers are capable of parallel inputting and outputting and serial outputting. The output from the key switch 2 is read in the shift registers 3 by output clock pulses 4 from a master oscillator 1. Then, this parallel output is applied to a block detector circuit 4 to detect those of the blocks in which even one key switch is closed, and then the detecting outputs are applied to a priority circuit 5. The priority circuit 5 outputs the block which has been designated earlier than any other blocks. Further, when even one block has been detected to be "1", the operation of parallel reading of the abovesaid key switch outputs is inhibited. The output of the block selected with first priority is applied to a block designating gate 6, through which the clock pulses $\phi$ are supplied to the designated one of the blocks of the shift registers 3, performing serial reading of the block. At the same time, the clock pulses $\phi$ are applied to a counter 8 to start counting of them. The count value is supplied to a gate circuit 9, and becomes a key code IKC in the block. On the other hand, the output from the priority circuit 5 is applied to an encoder 7 to derive therefrom a block code BKC, which is supplied to the gate circuit 9. The serial output from the shift register group 3 is applied to the gate circuit 9 to open and close it. That is, the serial output and the counter output are synchronized with each other and the data derived from the gate circuit 9 is a key code data KCD. Then, serial reading of the block of first priority takes place and when the content of the block becomes "0" and when the block detector circuit 4 detects "0", the priority circuit 5 outputs the block of second priority and the clock pulses $\phi$ are applied to the next block of the shift register group 3 through the block designating gate circuit 6. At this time, a change detector circuit 10 detects the change of the block, and resets the counter 8 to retain the synchronizing relationship between the serial output from the shift register and the count value of the counter 8. Thus, the same operation is repeatedly achieved and, upon completion of outputting of required blocks, the shift register group is shifted from the serial reading to the parallel reading operation.

Thus, one frame is related to the number of blocks in which the key switches are closed and the positions of the closed key switches in the blocks, and is not always constant but largely dependent upon the number of blocks.

Figure 2:
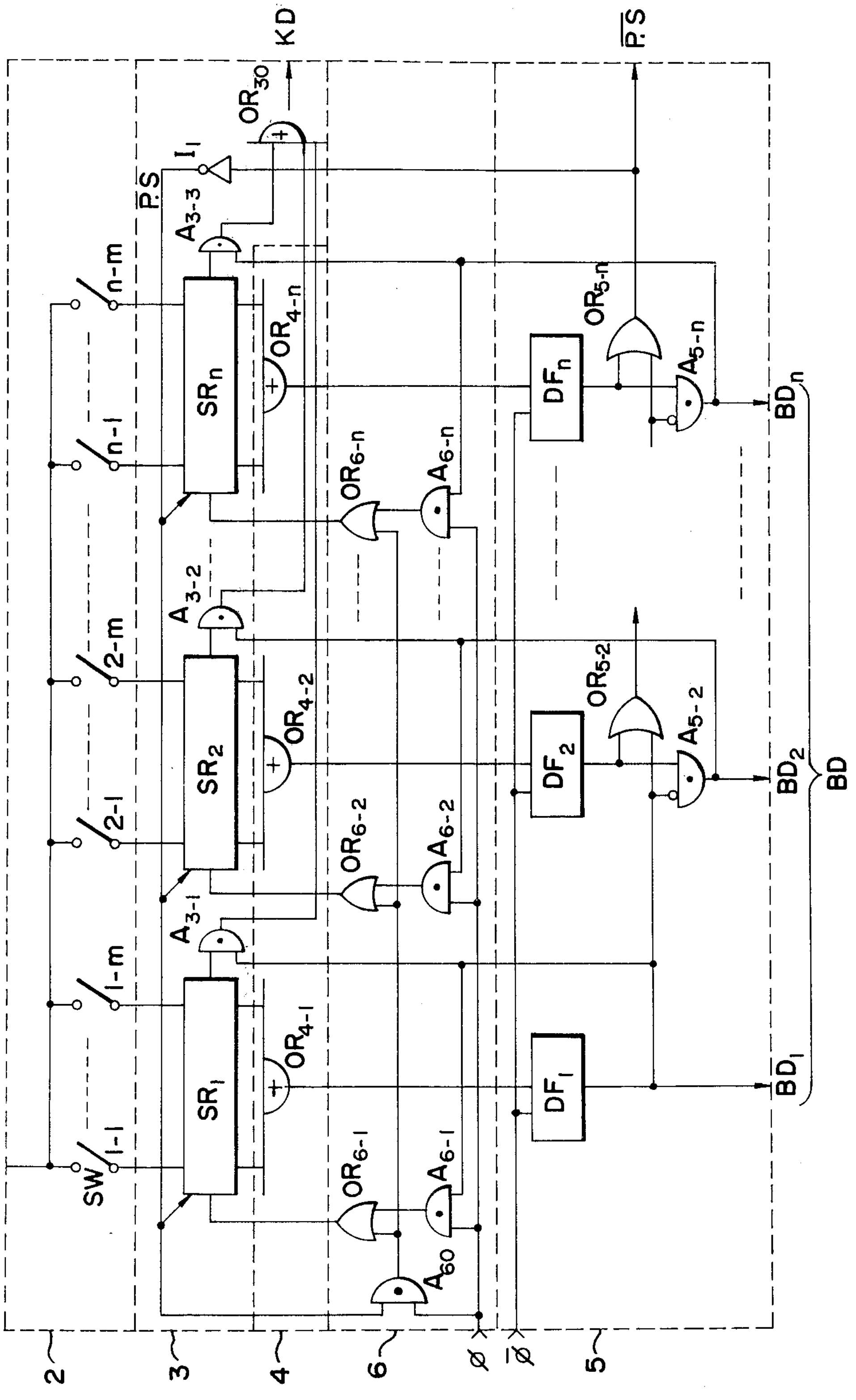
FIGS. 2 and 3 show in detail the principal parts of the embodiment depicted in FIG. 1.

FIG. 2 is a detailed diagram explanatory of the key switch 2, the shift register 3, the block detector 4, the priority circuit 5 and the block detecting gate 6, in the embodiment shown in FIG. 1. In FIG. 2, shift register groups $SR_1$ to $SR_n$ are respectively connected to key switch groups $SW_{1-1}$ to $SW_{1-m}$, $SW_{2-1}$ to $SW_{2-m}$, . . . $SW_{n-1}$ to $SW_{n-m}$, each consisting of m key switches, so that the key switches are divided into n blocks. In this case, the number of lines connected to the individual blocks is selected to be m in common to them, but need not always be the same. The number of lines connected in parallel to one shift register, that is, the number of bits of the shift register is defined by the count value of the counter 8. In the present embodiment, the number of bits of each of the shift registers is selected to be m. The output from an inverter $I_1$ is given as a P.S (parallel.-serial) signal which controls parallel read-in and serial read-out of the shift registers $SR_1$ to $SR_n$. Now, let it be assumed that the P.S signal is "1" to designate parallel read-in operation of the shift register group 3, that the clock pulses $\phi$ are applied to the shift registers $SR_1$ to $SR_n$ through OR circuits $OR_{6-1}$ to $OR_{6-n}$ and that the key switches $SW_{2-1}$, $SW_{2-4}$ and $SW_{3-2}$ are closed. The information of these closed key switches is written by the clock pulses $\phi$ in the shift registers $SR_2$ and $SR_3$. The information written in the abovesaid shift registers is applied to OR circuits $OR_{4-1}$ to $OR_{4-n}$ respectively connected to the individual blocks corresponding to the parallel outputs from the shift register group 3, so that the OR circuits $OR_{4-2}$ and $OR_{4-3}$ derive therefrom outputs "1", respectively. Then, these outputs are respectively supplied to D type flip-flops $DF_1$ to $DF_n$, each corresponding to one of the blocks. The outputs from the OR circuits $OR_{4-2}$ and $OR_{4-3}$ are written by clock pulses $\phi$ in the D type flipflops $DF_2$ and $DF_3$. The outputs from the D type flip-flops $DF_1$ to $DF_n$ are applied to the priority circuit composed of OR circuits and AND circuits, thereby selecting one block which is designated with first priority. Now, since the D type flip-flops $DF_2$ and $DF_3$ are both providing the outputs "1", the output "1" from the D type flip-flop $DF_2$ is applied to an OR circuit $OR_{5-2}$, causing the OR circuits $OR_{5-3}$ to $OR_{5-n}$ to produce outputs "1". As a result of this, AND circuits $A_{5-3}$ to $A_{5-n}$ are each supplied with an inverted input "0" and inhibited thereby from outputting. On the other hand, an AND circuit $A_{5-2}$ is supplied with an inverted input "1" to provide an output "1". The outputs from the D type flip-flop $DF_1$ and the AND circuits $A_{5-2}$ to $A_{5-n}$ are applied as block data BD to the encoder 7 shown in detail in FIG. 3. Then, a P.S. signal derived from the OR circuit $OR_{5-n}$ is inverted by the inverter $I_1$ to provide the P.S signal "0", by which the shift register group 3 is designated to be serially read out. Further, the output $BD_2$ from the AND circuit $A_{5-2}$ is applied to the AND circuits $A_{6-2}$ and $A_{3-2}$ and the clock pulses $\phi$ are supplied to the shift register $SR_2$ to be serially read out. Moreover, serial information is applied from the AND circuit $A_{3-2}$ to an OR circuit $OR_{30}$, whose output is applied as key data KD to the D type flip-flop $DF_2$ shown in FIG. 3. The information in the shift register $SR_2$ is sequentially shifted and, at the same time, the OR circuit $OR_{4-2}$ is also supplied with a parallel output and detects "0" when the last data is shifted. This state is written by the next clock pulse $\phi$ in the D type flip-flops $DF_1$ to $DF_n$. In this case, the D type flip-flop $DF_2$ derives therefrom an output "0" and the output from the D type flip-flop $DF_3$ based on the next priority level is derived from an AND ciruit $A_{5-3}$ to apply "1" to AND circuits $A_{6-3}$ and $A_{3-3}$, thus sequentially shifting the information of the shift register $SR_3$. When shifting of the information of all the blocks has thus been completed, the OR circuits $OR_{4-1}$ to $OR_{4-n}$ of the block detector circuit 4 all produce "0" and all the D type flip-flops $DF_1$ to $DF_n$ also produce "0". As a result of this, the P.S signal derived from the inverter $I_1$ becomes "1", performing the parallel read-in operation again. The operations described above cover one frame and, by the clock pulse $\phi$, the same operations are repeated.

Figure 3:
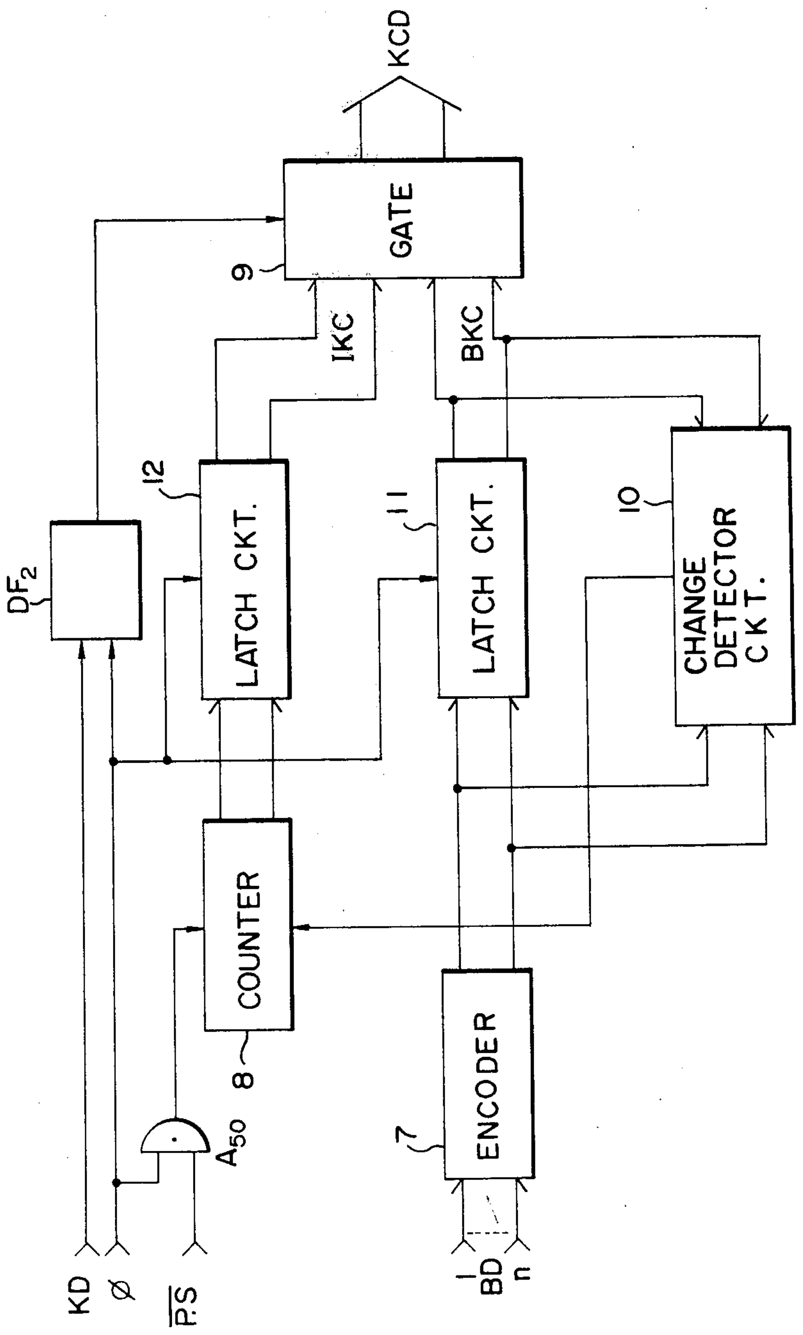

FIG. 3 is a detailed diagram explanatory of the operations associated with the encoder 7, the counter 8, the gate circuit 9 and the change detector circuit 10 employed in the FIG. 1 embodiment. In FIG. 3, the block information BD derived from the priority circuit 5 is applied to the encoder 7 and rendered into a binary code as a block code BKC. This output is applied to a latch circuit 11, and always latched by the clock pulse $\phi$. The block code BKC is applied to the gate circuit 9. Further, in an AND circuit $A_{50}$, the clock pulse $\phi$ is gated with the P.S signal, and applied to the m-scale counter 8. The output from the counter 8 is latched by the clock pulse $\phi$ in a latch circuit 12, and supplied as an intra-block key code IKC to the gate circuit 9. Further, the key data signal KD is applied to a D terminal of the D type flip-flop $DF_2$, and temporarily latched by the clock pulse $\phi$. The output from the D type flip-flop $DF_2$ is supplied to the gate circuit 9 to control its opening and closing. The latch circuits 11 and 12 and the D type flip-flop $DF_2$ are to provide timing and perform waveform shaping. Next, the change detector circuit 10 for detecting a change in the block data BD detects non-coincidence between the input and output codes of the latch circuit 11 to reset the counter 8, by which when the block has changed, counting is caused to start with "0". The signals of the key data KD and the block data BD shown in FIG. 2 are both rendered into binary codes in synchronism with each other, and derived as key code data KCD from the gate circuit 9.

Figure 4:
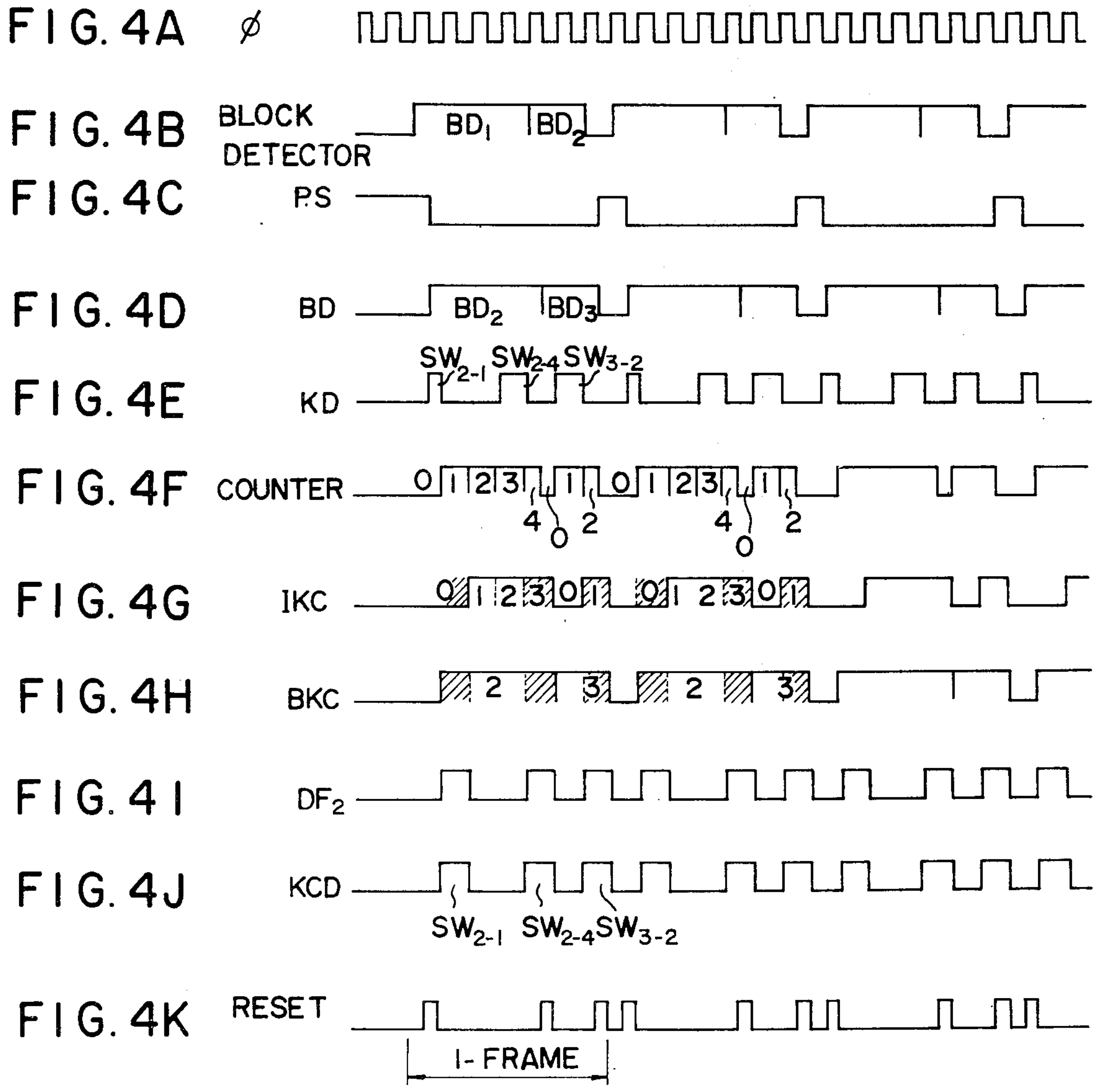
FIGS. 4A–4K show logic-time charts indicating the operation of the embodiment illustrated in FIGS. 2 and 3.

FIG. 4 shows a series of waveform diagrams, illustrating timings of the respective signals in FIGS. 2 and 3. In FIG. 4, a block detecting waveform of FIG. 4B is shown as the outputs from the OR circuits $OR_{4-1}$ to $OR_{4-n}$ respectively connected to the individual blocks of the shift registers $SR_1$ to $SR_n$ shown in FIG. 2, relative to the clock pulses $\phi$ of FIG. 4 A. The P.S signal of FIG. 4C is shown as the output from the inverter $I_1$ for controlling the parallel read-in and serial read-out of the shift registers $SR_1$ to $SR_n$. The block data BD of FIG. 4D show, as the output waveform of the priority circuit 5, the outputs from the D type flip-flop $DF_1$ and the AND circuits $A_{5-2}$ $A_{5-n}$ that the waveform of FIG. 4B is latched with the clock pulse $\phi$. For example, the block data $BD_2$ and $BD_3$ and are shown as the priority levels. FIG. 4E shows the key data KD of each block, and shows the outputs from the switches, for instance, $SW_{2-1}$, $SW_{2-4}$ and $SW_{3-2}$, as the output from the OR circuit $OR_{30}$. The counter output of FIG. 4F is derived from the counter when the clock pulse $\phi$ is gated by the P.S signal of FIG. 4C in the AND circuit $A_{50}$ and then applied to the counter, as shown in FIG. 3. When the counter output is latched by the clock pulse $\phi$, the waveform of the intrablock key code IKC shown in FIG. 4G is obtained. The block code BKC of FIG. 4H is obtained by coding the block data of FIG. 4D into a binary code and then latching it with the clock pulse $\phi$. Further, the output from the D type flip-flop $DF_2$, shown in FIG. 4I, is obtained by latching the key data KD of FIG. 4E with the clock pulse $\phi$. By applying the intra-block key code IKC of FIG. 4G and the block code BKC of FIG. 4H to gate 9 and by controlling it with the output from the D type flip-flop $DF_2$, there is obtained the key code data KCD of FIG. 4J. The reset signal of FIG. 4K shows one frame period. As is seen from the above description, even if the block data BD and the counter output are gated by the key data KD, the key code data are obtained, but since the block data BD and the counter output have different pulse widths, they are once applied to the latch circuits, respectively, to obtain the block code BKC and the intra-block key code IKC, which are gated by the output from the D type flip-flop $DF_2$ to obtain the same pulse width. Further, the key code to be outputted may be made to be a different binary code by freely determining the value of the counter.

As has been described in the foregoing, according to this invention, a waveform distortion resulting from scanning of the key switch and an erroneous operation can be prevented by temporarily storing the closed state of the key switch, and the time for sending information of unnecessary block can be eliminated by outputting key information every plural blocks. Further, also in the case of that block, as soon as the final data is outputted therefrom, the operation is shifted to the next block, by which a required time slot can be remarkedly reduced and, moreover, the time for the generation of the key code corresponding to closing of the key switch can be greatly shortened so as to adapt for high-speed operation resulting from integration. Thus, a highly responsive key code generator circuit can be realized.

It will be apparent that many modifications and variations may be effected without departing from the scope of novel concepts of this invention.

What is claimed is:

1. A key code generator comprising:

a group of memories, each corresponding to a respective one of a corresponding group of blocks of key switches and for temporarily storing in parallel the closed states of the switches in a concurrent manner and capable of providing both a serial and a parallel output for each block;

a block detector for concurrently detecting all the memories corresponding to those blocks that have even one key switch in its closed state, by reading the parallel output from said memories;

a priority selector for sequentially designating the detected blocks in a predetermined order of priority;

a block designating gate means for supplying clock pulses to the memories corresponding to the designated blocks to serially read out therefrom key data in accordance with the output from the priority selector;

an encoder for encoding the output from the priority selector into a binary code; and means for detecting a change in the output from the encoder to reset the block designating gate means when the key data is no longer detected from the read out memories.

2. A key code generator as in claim 1 and wherein said means for detecting further comprises:

a counter for counting the clock pulses outputted from the block designating gate means;

means for gating the count value of the counter and the binary code designating each block with the serial output read out of each memory;

detector means for detecting a change in the binary code; and means for resetting the counter with the output from the detection means, wherein the information from said means for gating is used as the key code information.

3. A key code generator as in claim 2 and further comprising a latch means respectively interspaced between said counter and said gating means, said encoder and said gating means and said serial output from said memories and said gating means, and wherein each of said latching means are synchronized by said clock pulses.

* * * * *